US005760657A

United States Patent [19]
Johnson

[11] Patent Number: 5,760,657
[45] Date of Patent: Jun. 2, 1998

[54] METHOD AND APPARATUS EMPLOYING A PROCESS DEPENDENT IMPEDANCE THAT COMPENSATES FOR MANUFACTURING VARIATIONS IN A VOLTAGE CONTROLLED OSCILLATOR

[75] Inventor: Luke A. Johnson, Tempe, Ariz.

[73] Assignee: Intel Corporation, Santa Clara, Calif.

[21] Appl. No.: 723,559

[22] Filed: Sep. 30, 1996

[51] Int. Cl.[6] .................. H03B 5/04; H03B 5/24
[52] U.S. Cl. .................. 331/175; 331/34; 331/57; 331/177 R
[58] Field of Search .................. 331/8, 17, 34, 331/57, 108 R, 111, 116, 175, 177 R

[56] References Cited

U.S. PATENT DOCUMENTS

| | | |
|---|---|---|
| 5,072,197 | 12/1991 | Anderson .................. 331/175 X |
| 5,600,281 | 2/1997 | Mori et al. .................. 331/57 |
| 5,600,284 | 2/1997 | Nguyen et al. .................. 331/175 X |

*Primary Examiner*—David Mis
*Attorney, Agent, or Firm*—Blakely, Sokoloff, Taylor & Zafman

[57] ABSTRACT

A voltage controlled oscillator (VCO) having a current source and a process dependent (or process controlled) impedance is disclosed. The voltage controlled oscillator includes a current mirror that generates a reference current in response to a control current. The reference current is proportional to the control current. The process dependent impedance, which is coupled to the current mirror, compensates the reference current to account for process variations in the manufacture of the (VCO) circuit.

12 Claims, 7 Drawing Sheets

METHOD AND APPARATUS EMPLOYING A PROCESS DEPENDENT IMPEDANCE THAT COMPENSATES FOR MANUFACTURING VARIATIONS IN A VOLTAGE CONTROLLED OSCILLATOR

BACKGROUND OF THE INVENTION

1. Field of the Invention

This invention relates generally to a phase locked loop (PLL) having a voltage controlled oscillator (VCO), and more specifically to a method and apparatus employing a process dependent impedance that compensates for manufacturing variations in a voltage controlled oscillator.

2. Description of the Related Art

A phase locked loop (PLL) typically includes a voltage controlled oscillator (VCO) that has an input (a voltage control node) for receiving a control voltage. The VCO operates with a minimum frequency range over a proper range of voltages (i.e., a range of allowable voltages that may be applied to the voltage control node). The gain of the VCO is simply the slope of the output frequency versus the control voltage and has the units of frequency divided by voltage (e.g., MHz/V). It is optimal for the VCO to be designed with the minimum amount of gain that delivers the required frequency range to reduce jitter and ease stability requirements on the low pass filter (LPF) employed in the PLL.

A process corner is simply a particular set of conditions related to processing involved in the manufacture and fabrication of an integrated circuit. There is a variation of process that exists from the manufacture of one lot of chips to the manufacture of a second lot of chips. Variation of process may include mask errors in the lithography and fabrication of the die, which can lead to the overdoping or underdoping of the transistors of the circuit.

An overdoped batch of semiconductor die results in strong transistors (i.e., a batch of transistors that have more carriers and a greater current capacity) which can sink twice as much current as was originally anticipated by the circuit design. Alternately, underdoping a batch of semiconductor die results in weaker transistors that may sink only one-half of a nominal current.

Process corners include, but are not limited to, a fast process corner, a slow process corner, a n-fast/p-slow corner and a p-fast/n-slow corner. In a fast corner, all the transistors in the circuit are strong (i.e., all the transistors sink more current than was anticipated by the design). In a slow process corner, all the transistors sink less current than was anticipated by the circuit design. In a n-fast/p-slow process corner, the N-MOS transistors sink more current than was anticipated, while the P-MOS transistors sink less current than was anticipated by the circuit design. Similarly, in a p-fast/n-slow process corner, the N-MOS sink relatively less current, while the P-MOS transistors sink relatively more current than was anticipated by the circuit design.

Since the VCO must deliver the necessary frequency range across all process corners, a designer is forced to design a circuit with more gain than optimal (i.e., more gain than would be needed if process variations were not an issue). The nominal circuit must be designed with more gain to ensure that the full frequency range is delivered in the event of a slow process corner. The PLL, then, must be capable of stable operation in the event of a fast process corner where the VCO has more gain than the nominal case. This is reflected in the frequency versus input control voltage graph (plot) across corners. Each corner exhibits a different slope, and hence, different gain.

One prior art VCO design employs a voltage-controlled current source (VCCS) that drivers a ring oscillator. At fast splits (all transistors stronger than nominal), the current source (i.e., VCCS) outputs slightly more current because the transistors of the VCCS are stronger. Simultaneously, a smaller current is needed to produce the desired frequency (i.e., the ring oscillator transistors are also stronger). This situation causes the gain at the fast process corner to be extremely sharp (i.e., the slope of the frequency versus control voltage graph is large), thereby increasing jitter and reducing stability.

Jitter refers to spurious deviations from the ideal, lock frequency. Increased gain in the VCO results in increased frequency deviation for a given fluctuation on the power supplies or control voltage as a result of noise. Therefore, it is beneficial to minimize the VCO gain.

One approach to reduce the likelihood of feedback oscillation in the PLL is to employ a capacitor in the low-pass filter that precedes the VCO, to block feedback oscillations. However, this approach wastes die area because an unrealistically large capacitor is typically required. For example, on some designs, the minimum capacitor required to stabilize the PLL across corners exceeds 1000 pF. Capacitors of this size occupy large amounts of area on the die. As die area is often directly related to cost, it is economically advantageous to reduce this area as much as possible. It is desirable, then, to reduce the maximum gain of the VCO (typically encountered at the fast process corner) to ease the requirements on the loop-filter (low-pass filter).

Accordingly, a method and apparatus that reduces the effects of process corners and allows a designer to design a VCO with less gain while maintaining circuit stability is desirable.

SUMMARY OF THE INVENTION

A phased locked loop (PLL) includes a Voltage Controlled Oscillator (VCO). The VCO includes a voltage control node and provides a minimum specified gain (MHz/V) over a specified range of voltages that are supplied to the voltage control node. The VCO of the present invention includes a first node (i.e., the voltage controlled node) for receiving a control voltage and a current mirror, coupled to the first node, for generating a reference current in response to the first control voltage. The reference current is proportional to the control voltage. The present invention further includes a process controlled impedance, which in one embodiment is a triode MOS device. The process controlled (or process dependent) impedance is coupled to the process dependent reference node, and adjusts and compensates the reference current to account for process variations in the manufacture of the VCO circuit. The use of the process dependent impedance is a significant improvement over a voltage controlled current source. Whereas a current source only provides an offset to the frequency versus control voltage graphs, the process dependent impedance, employed by the present invention, modulates the gain.

BRIEF DESCRIPTION OF THE DRAWINGS

The present invention is illustrated by way of example and not limitation in the figures of the accompanying drawings in which like references indicate similar elements.

DETAILED DESCRIPTION OF THE INVENTION

In the following detailed description of the present invention, numerous specific details are set forth in order to provide a thorough understanding of the present invention. However, it will be obvious to one skilled in the art that the present invention can be practiced without these specific details. In other instances, well known electrical structures and circuits are shown in block diagram form in order not to unnecessarily obscure aspects of the present invention.

Figure 1:
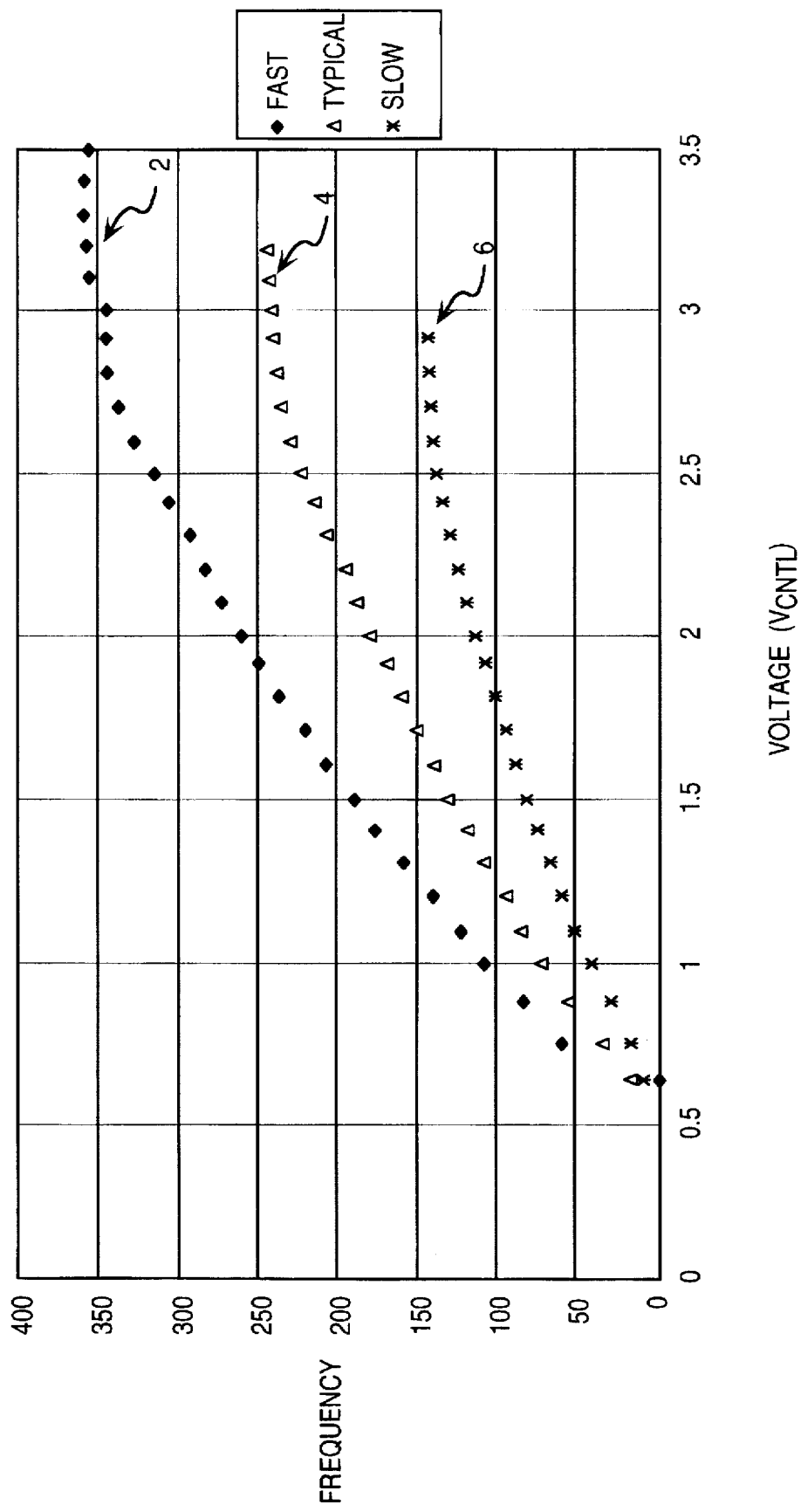
FIG. 1 illustrates a graph of the frequency versus control voltage at different process corners for a typical voltage control oscillator.

FIG. 1 is a graph of the frequency versus the control voltage at different process corners for a typical prior art voltage controlled oscillator. FIG. 1 illustrates a first graph 2 for the voltage controlled oscillator at the fast process corner, a second graph 4 for the voltage controlled oscillator at a typical or nominal process corner, and a third graph 6 for the voltage controlled oscillator at a slow process corner. As is evident, the slope of graphs 2, 4, 6 (i.e., the derivative of the frequency with respect to the control voltage at the different process corners) are different and vary widely from the fast corner (graph 2) to the slow corner (graph 6). Accordingly, a designer must design with at least three different gains in mind since the gain of the voltage controlled oscillator is simply the derivative of the frequency with respect to the control voltage (i.e., the slope of graphs 2, 4, and 6).

Figure 2:
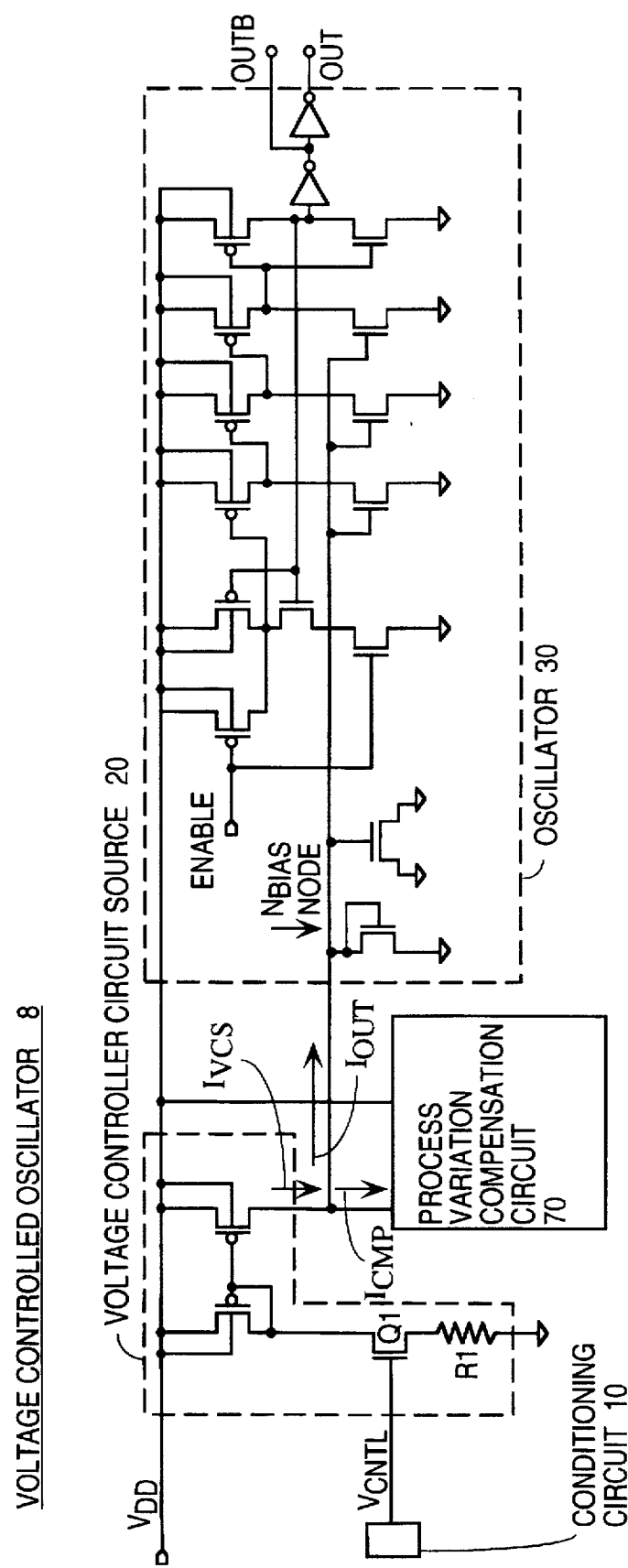
FIG. 2 illustrates a voltage controlled oscillator (VCO) in which the present invention can be implemented.

FIG. 2 illustrates a VCO 8 in which the present invention can be implemented. The VCO 8 can optionally include a conditioning circuit 10 to provide a wider input range. The conditioning circuit 10 will be described in greater detail hereinafter with reference to FIG. 5. The VCO 8 further includes a voltage controlled current source 20 that is coupled to the conditioning circuit 10. The voltage controlled current source 20 includes a first input for receiving a voltage control signal from the voltage controlled generation unit 10 and in response to the voltage control signal generates a reference current.

The VCO 8 further includes an oscillator 30 that includes a plurality of current mirrors. The oscillator 30 includes a first input for receiving the reference current generated by the voltage controlled current source 20. The voltage controlled current source 20 and the oscillator 30 are well known in the art, and it will be appreciated by those skilled in the art that the implementation of blocks 20 and 30 will vary depending on the specific application and associated design parameters and constraints.

In a typical prior art VCO, the reference current ($I_{vcs}$-current generated by the voltage controlled current source) is provided as $I_{out}$ to the oscillator 30.

The process variation compensation circuit 70 of the present invention modifies the reference current ($I_{vcs}$) by an amount ($I_{cmp}$) (the compensation current). Accordingly, in a VCO 8 that is configured in accordance with the present invention the $I_{out}$ current that is provided to the oscillator 30 is the difference between $I_{vcs}$ and $I_{cmp}$. The process variation compensation circuit 70 sinks a current in the amount of $I_{cmp}$ which varies according to both $I_{vcs}$ and process.

Figure 3:
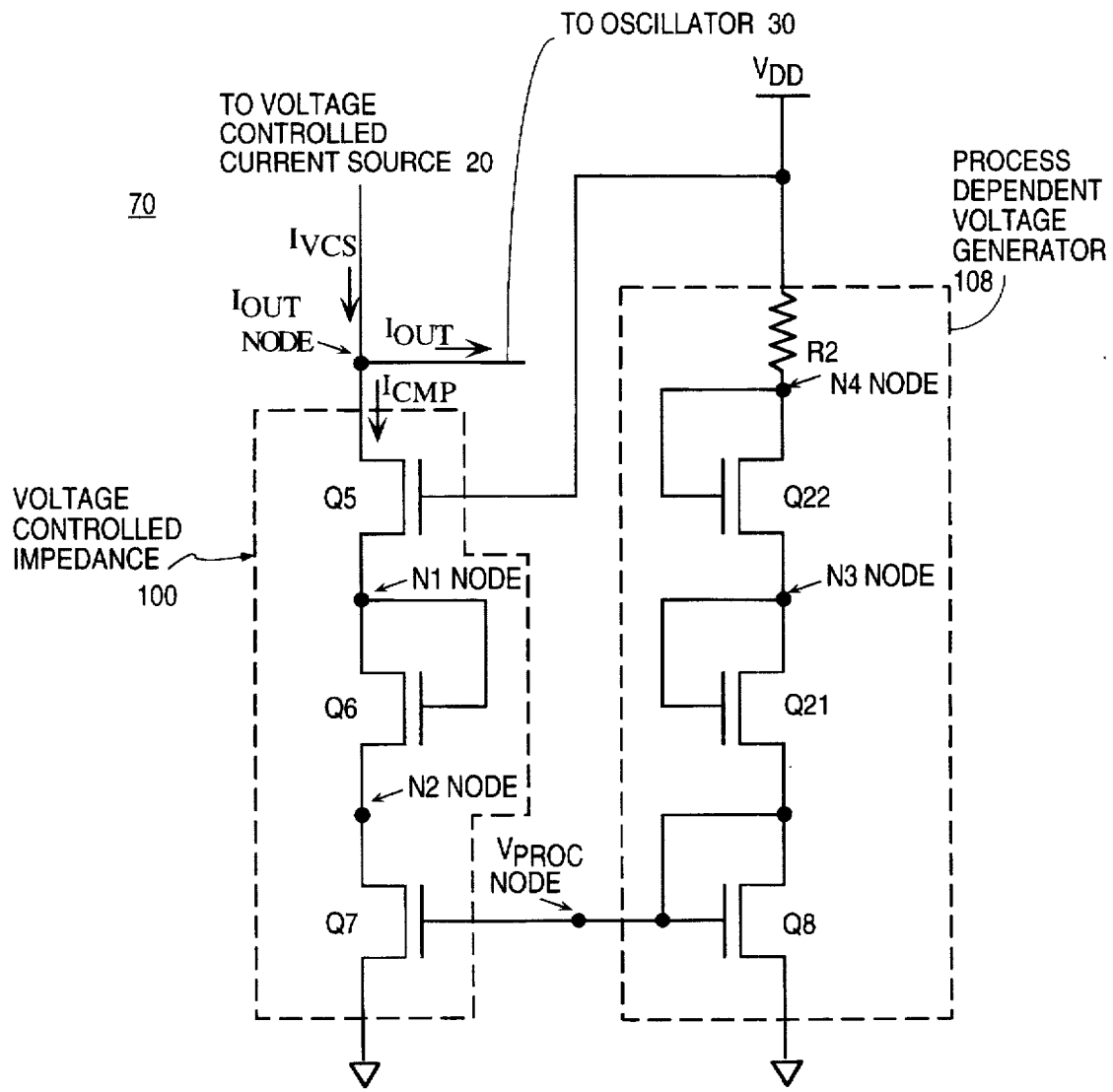
FIG. 3 illustrates a circuit diagram of one embodiment of the present invention as implemented in a voltage controlled oscillator (VCO).

FIG. 3 illustrates in greater detail the process variation compensation circuit 70 of one embodiment of the present invention. The process variation compensation circuit 70 includes a process dependent voltage generator 108 and a voltage controlled impedance 100. The process dependent voltage generator 108 generates a control voltage and provides the control voltage to the voltage controlled impedance 100. The voltage controlled impedance 100 that is coupled to the process dependent voltage generator 108 modifies the reference current ($I_{cmp}$) based on said control voltage. In this embodiment, the voltage controlled impedance 100 of the present invention includes three transistors (Q5, Q6, and Q7). These transistors can be implemented by employing metal oxide semiconductor (MOS) devices (Q5 and Q7) that are being biased in the triode region. Transistors Q5, Q6 and Q7 each include a gate electrode, a drain electrode, and a source electrode. The drain electrode of transistor Q5 is coupled to the $I_{out}$ node. The gate electrode of transistor Q5 is coupled to a first reference voltage (e.g., Vcc), and the source electrode of transistor Q5 is coupled to a N1 node. The drain electrode and the gate electrode of transistor Q6 are coupled together and to the N1 node, and the source electrode of transistor Q6 is coupled to a N2 node. The drain electrode of transistor Q7 is coupled to the N2 node. The gate electrode of transistor Q7 is coupled to a $V_{proc}$ node, and the source electrode of transistor Q7 is coupled to a second reference voltage (e.g., a ground potential).

The process dependent impedance 100 of the present invention can also be implemented with other devices, such as, bipolar junction transistors (BJTs) and junction field effect transistors (JFETs). The BJTs and JFETs can be used if properly biased to provide the process dependent impedance 100 of the present invention. Moreover, it is apparent to those skilled in the art that a single device can be employed to implement the process independent impedance circuit 100 of the present invention, as long as the gate electrode and drain electrode of the device employed is biased properly so that an impedance having process dependence is realized.

Transistor Q6 with its drain electrode and gate electrode tied together form a diode that generates a voltage drop between the N1 node and the N2 node. This voltage drop of approximately 0.7 volts places transistors Q5 and Q7 in the triode region of operation. Specifically, the drain-source voltage ($V_{DS}$) of transistors Q5 and Q7 is less than the difference between the gate-source voltage ($V_{GS}$) and the threshold voltage ($V_T$) (i.e., $V_{DS} < V_{GS} - V_t$). It will be understood by those skilled in the art that a MOS device operating in a triode region behaves like a voltage controlled impedance or a resistor, whose resistance value depends on the gate-source voltage ($V_{GS}$).

The voltage controlled impedance 100, includes a transistor, Q5 with its drain coupled to the voltage controlled current source 20 (specifically the $I_{out}$ node), its gate connected to $V_{dd}$, and its source connected to the gate and the drain of Q6 (via N1). The source of Q6 connects to the drain of Q7 via N2. The source of Q7 connects to $V_{ss}$, and the gate of Q7 connects to a process-dependent control node ($V_{proc}$). The impedance looking into the drain of Q5, then, is dependent on this control voltage ($V_{proc}$).

The process dependent voltage generator 108 in this embodiment includes transistors Q8, Q21, and Q22 and resistor R2. Each of the transistors Q8, Q21, Q22 includes a gate electrode, a drain electrode and a source electrode. The source electrode of transistor Q8 is coupled to the second reference voltage (e.g., a ground potential), and the gate electrode and the drain electrode of transistor Q8 are coupled together and to the $V_{proc}$ node. The source electrode of transistor Q21 is coupled to the drain electrode of transistor Q8 and to the $V_{proc}$ node. The gate electrode and a drain electrode of transistor Q21 are coupled together at a N3 node. The source electrode of transistor Q22 is coupled to the drain of Q21 and to the N3 node, and the gate electrode and the drain electrode of Q22 are coupled together and also to a N4 node. The drain of Q22 and the N4 node are coupled to the first reference voltage (e.g., $V_{dd}$) through a resistor R2. It will be noted by those skilled in the art that transistors Q8, Q21, and Q22, as configured in FIG. 3, form a series of diodes each having an approximate voltage drop of 0.7 volts.

It will be understood to those skilled in the art that the actual implementation of the process dependent voltage generator 108 will vary from design to design and is specifically tailored to target other elements in the circuit and to compensate for those elements. For example, in this design, resistor R2 targets and compensates for variations in the reference voltage R1, illustrated in FIG. 2.

The process dependent voltage generator 108 is designed to target resistor R1 for compensation. The process dependent voltage generator 108 also provides power and compensation for NMOS transistors. A replicate resistor (R2), which is identical to the resistor (R1) employed in the voltage-controlled current source, is placed in series with three diodes (Q8, Q21 and Q22). As the resistance on the replicate resistor increases, the output reference voltage ($V_{proc}$) decreases. This decrease in the output ($V_{proc}$) of the process dependent voltage generator 108 results in an increase in the impedance of the process dependent impedance circuit 100. Therefore, less current ($I_{cmp}$) is diverted from $I_{vcs}$ resulting in more current delivered to the ring oscillator (i.e., an increase in $I_{out}$). This increase in $I_{out}$ current opposes the decrease in $I_{cvs}$ resulting from the increased R1 resistance. Therefore, compensation is achieved.

The process variation compensation circuit 70 also provides some compensation for NMOS transistors because of the weak dependence of $V_{proc}$ on the strength of NMOS transistors. The resistor/diode divider configuration of the process dependent voltage generator 108 provides a voltage ($V_{proc}$) that is relatively independent of the strength of NMOS transistors (e.g., Q22, Q21, Q8). However, the process-controlled impedance has a direct correspondence between its impedance and the NMOS device strength. Therefore, at fast corners, where the NMOS transistors are strong, and $I_{vcs}$ is correspondingly large, the process dependent impedance circuit 100 diverts a proportionately larger current ($I_{cmp}$) from the $I_{out}$ current whereby compensation is achieved.

The resistor/diode divider configuration of the process dependent voltage generator 108 also provides a dependence of $V_{proc}$ on the power supply voltage ($V_{dd}$). The process dependent impedance 100, then, is directly dependent on the power supply. As the power supply voltage increases, the amount of current diverted ($I_{cmp}$) from the output current $I_{out}$ increases correspondingly. This increase in $I_{cmp}$ correspondingly opposes the increase in the operation speed of the VCO.

Figure 4:
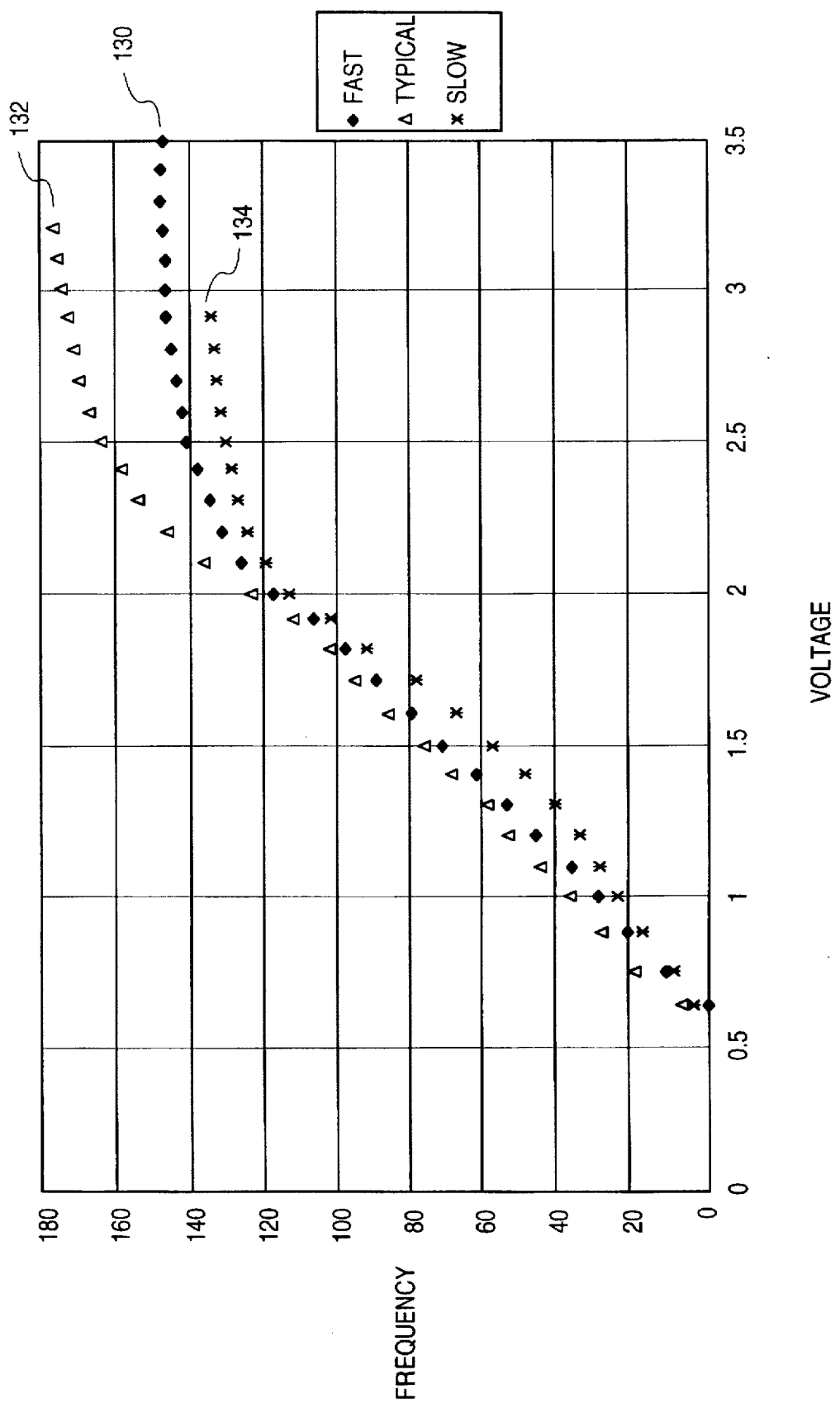
FIG. 4 is a graph of the frequency versus control voltage at different process corners for a VCO employing the process dependent impedance of the present invention and implemented in accordance with the teachings of the present invention.

FIG. 4 is a graph of the frequency versus the control voltage at different process corners for a voltage controlled oscillator implemented in accordance with the teachings of the present invention and employing the process variation compensation circuit of the present invention. As is evident from FIG. 4, the slope of the graph of the frequency versus control voltage for the fast corner 130, the slope of the frequency versus control voltage of the VCO at a typical or normal corner 132, and the slope of the graph of the frequency versus control voltage of the VCO at a slow corner 134 varies significantly less than the slopes illustrated in FIG. 1. Accordingly, when a circuit is configured in accordance with the teachings of the present invention, a designer can effectively design the circuit with one gain in mind.

Figure 5:
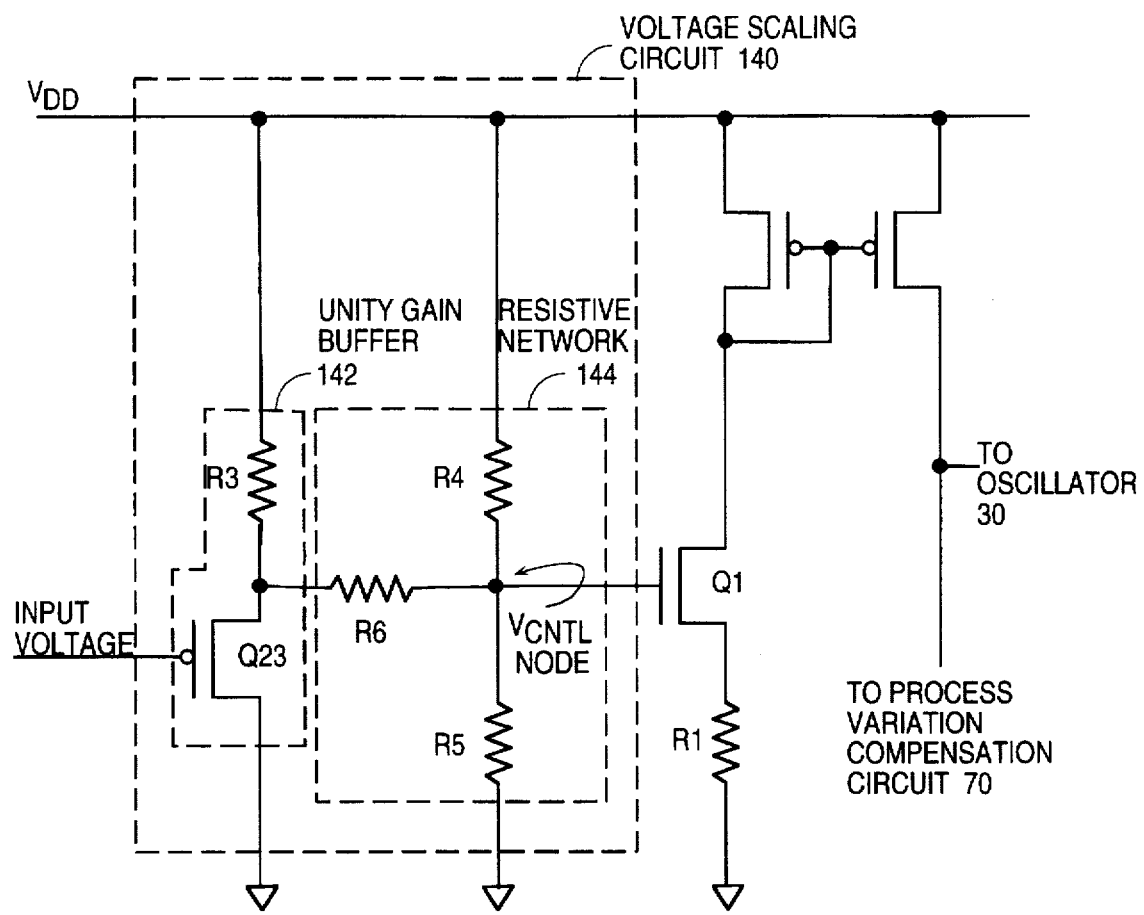
FIG. 5 illustrates a circuit diagram of a voltage scaling circuit employed by one embodiment of the present invention.

FIG. 5 illustrates a circuit which yields even more performance when used with the present invention. Examining FIG. 1 (prior art), one can see that the control voltage required for a given frequency is significantly different at each corner. In FIG. 4 (improved behavior), the voltage required for a given frequency is very well-behaved across corners. Since the control voltage is constrained to a smaller range, a circuit can be constructed which stretches this required input range to span a greater range. FIG. 5 illustrates a voltage scaling circuit 140 that accepts a range from 0.5V to 3V and scales it to correspond linearly to a small portion of the improved circuit range of FIG. 4.

The voltage scaling circuit 140 divides an input voltage approximately in half, while maintaining the output centered around the bias level $V_{cntl}$ (also referred to as an operating point). The voltage scaling circuit 140 includes an input for receiving an input voltage, a unity gain buffer 142 that provides a high impedance load to a previous stage (not shown), a resistive network 144 that performs scaling of the input voltage centered around an optimal operating point, and an output for generating an output voltage ($V_{cntl}$ node). The resistive network 144 includes a plurality of resistors (e.g.,R4,R5,and R6) that scale the input voltage centered around an optimal operating point.

The prior art circuits cannot maintain an optimal bias level (i.e., a fixed $V_{cntl}$) because the input voltage needed to generate a specified frequency at the output of the VCO differs for each process corner. The process variation compensation circuit 70 of the present invention enables the voltage scaling circuit 140 of the present invention to properly divide the input voltage by approximately one half while keeping the output centered about an optimal operating point or bias level. The voltage scaling circuit 140 allows a larger input range to be used to control a small frequency range (centered around 100 MHz in this example). Hence, VCO gain (MHz/V) is reduced.

Figure 6:
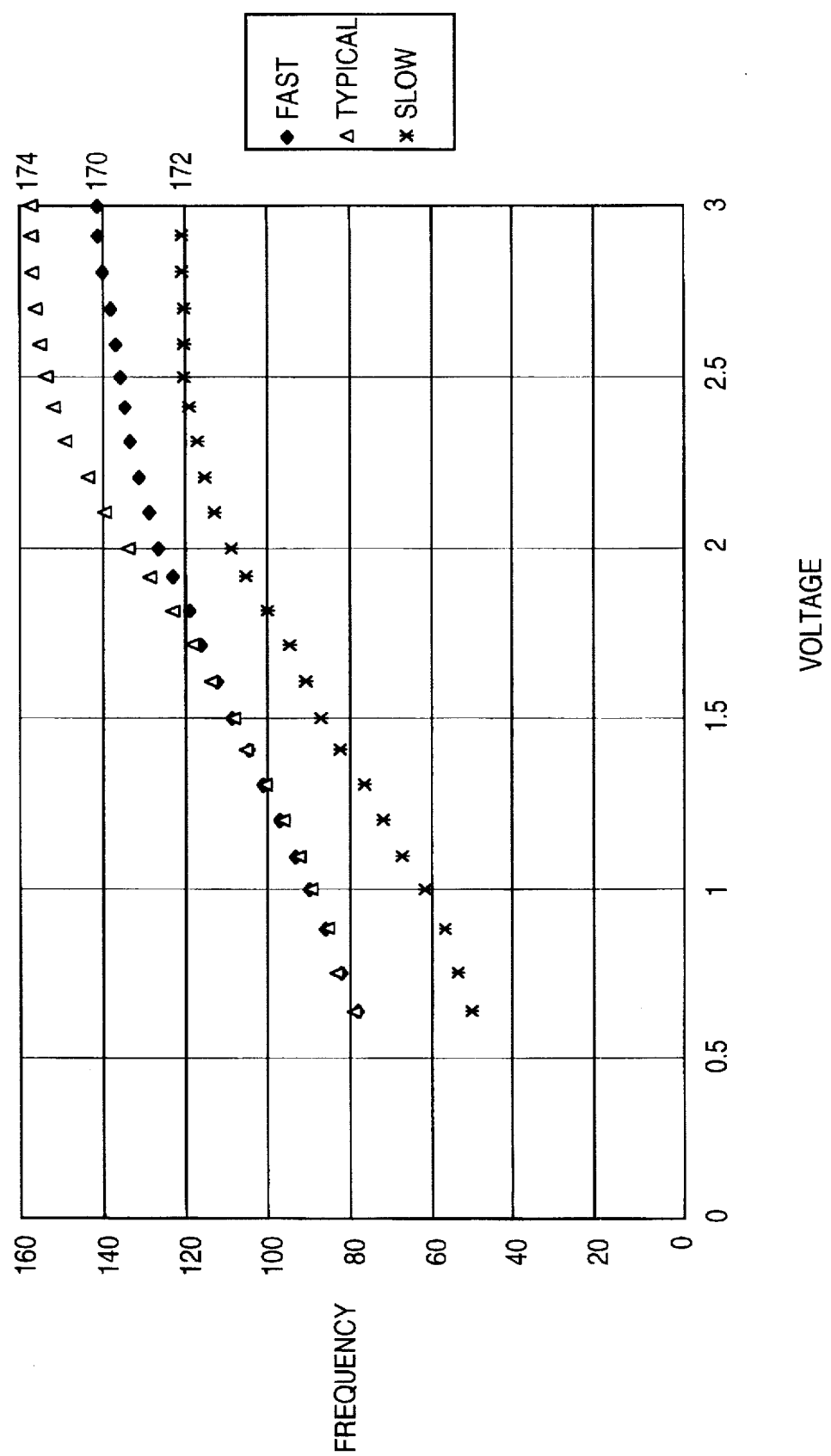
FIG. 6 illustrates a graph of the frequency versus control voltage at different process corners for a VCO implemented with the conditioning circuit, illustrated in FIG. 5, in accordance with the teachings of the present invention.

FIG. 6 is a graph of the frequency versus control voltage of the VCO at different process corners for the present invention incorporating the circuit illustrated in FIG. 5. The graph representing the behavior at fast corner 170, the graph representing the behavior at slow corner 172 and the graph representing the behavior at nominal or typical corner exhibit a gain that is closer to each other than that illustrated in FIG. 4.

Figure 7:
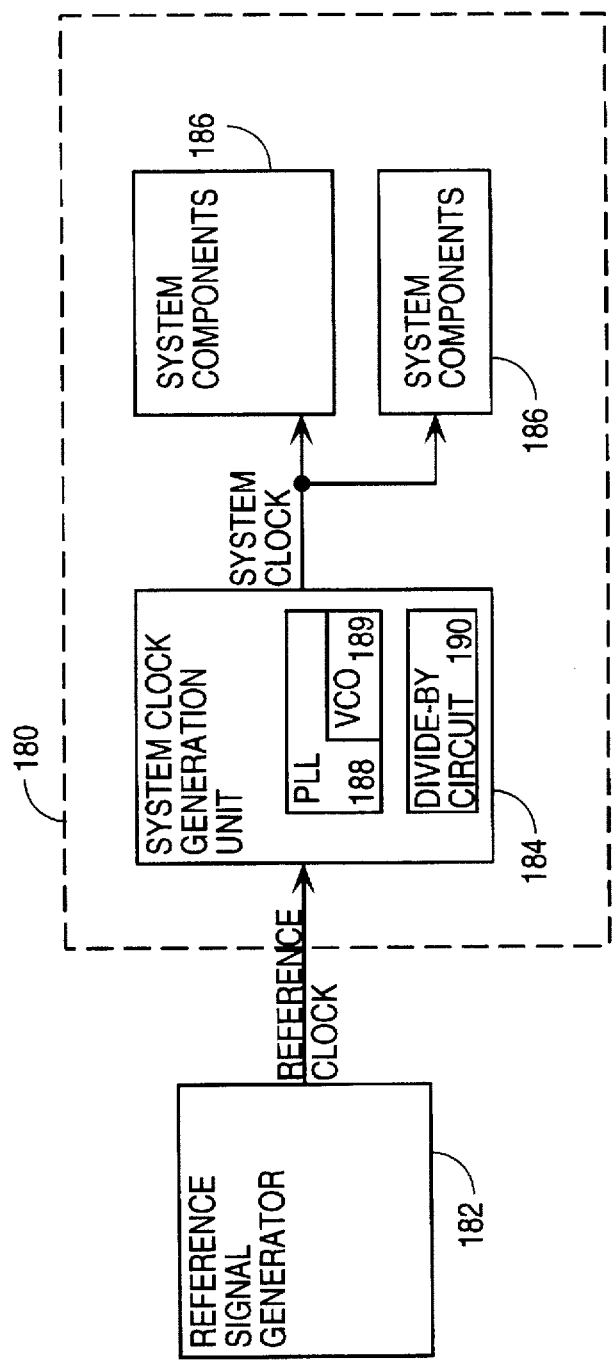
FIG. 7 illustrates a system in which the voltage controlled oscillator of the present invention can be implemented.

FIG. 7 illustrates a system 180 in which the voltage controlled oscillator of the present invention can be implemented. The system 180 includes system components 186 that require a clock signal. The system 180 can be a microprocessor, a transmitter, a receiver, a modem or other data processing device.

The system 180 includes system components 186 that need a system clock (SYS CLK) for synchronization purposes. The system 180 includes a system clock generation unit 184 that includes an input for receiving a reference clock and responsive to the reference clock generates the system clock. The system clock generation unit 184 typically includes a phase-locked loop (PLL) 188 that synchronizes the system clock to the reference clock. The phase-locked loop (PLL) 188 can include a voltage controlled oscillator 189 that incorporates the process variation compensation circuit 70 of the present invention. The system clock generation unit 184 typically also includes a divide-by circuit 190 that includes an input for receiving the system clock and that generates frequency multiples of the system clock.

The reference clock is generated by a reference signal generator 182 that can be external to the system 180 or incorporated as part of the system 180. The reference signal generator 182 can be an external crystal, another clock signal from a different system, or even a periodic data stream (e.g., data from a fiber optic bus).

In the foregoing specification, the invention has been described with reference to specific exemplary embodiments thereof. It will however be evident that various modifications and changes can be made thereto without departing from the broader spirit and scope of the invention as set forth in the appended claims. The specification and drawings are accordingly to be regarded as illustrative rather than restrictive.

What is claimed is:

1. A voltage controlled oscillator (VCO) comprising:
   a) a current mirror having an input and an output, said current mirror generating a reference current at said output in response to an input current received at said input, said reference current proportional to said input current; and
   b) a process dependent impedance, coupled to output of said current mirror, said impedance modifying said reference current in response to process variations introduced during the manufacture of said voltage controlled oscillator.

2. The voltage controlled oscillator of claim 1 wherein the process dependent impedance includes:
   a) a process dependent voltage generator for generating a control voltage, said control voltage dependent on said process variations; and
   b) a voltage controlled impedance, coupled to said process dependent voltage generator, for receiving said control voltage from said process dependent voltage generator and modifying said reference current based on said control voltage.

3. The voltage controlled oscillator of claim 2 wherein the voltage controlled impedance includes a metal oxide semiconductor (MOS) transistor, said MOS transistor operating in a triode region.

4. The voltage controlled oscillator of claim 1 wherein said voltage controlled oscillator further includes
   a) a source follower transistor having a gate electrode, a drain electrode, and a source electrode, said gate electrode coupled to receive a first voltage, said drain electrode and source electrode forming a current path, said transistor generating a first current in said current path, said first current proportional to said first voltage, said source follow transistor coupled to said current mirror; wherein said first current is proportional to said reference current.

5. The voltage controlled oscillator of claim 1 further comprising a process dependent biasing circuit that scales an input voltage to said source follower transistor to an operating point that increases VCO gain.

6. The voltage controlled oscillator of claim 5 wherein said biasing circuit includes a network of resistors, said network of resistors scaling said input voltage to an operating point to increase the gain of said VCO.

7. A system having a system component, said system component requiring a system clock, said system comprising:
   a) a reference signal generator, for generating a reference clock;
   b) a system clock generation unit, coupled to said reference signal generator, said system clock generation unit having an input for receiving said reference clock and responsive to said reference clock generating said system clock, said system clock generation unit providing said system clock to said system component, said system clock generation unit including:
      a voltage controlled oscillator (VCO) that includes
         i) a current mirror having an input and an output, said current mirror generating a reference current at said output in response to an input current received at said input, said reference current proportional to said input current; and
         ii) a process dependent impedance, coupled to output of said current mirror, said impedance modifying said reference current in response to process variations introduced during the manufacture of said voltage controlled oscillator.

8. The system of claim 7 wherein the process dependent impedance includes:
   a) a process dependent voltage generator for generating a control voltage, said control voltage dependent on said process variations; and
   b) a voltage controlled impedance, coupled to said process dependent voltage generator, for receiving said control voltage from said process dependent voltage generator and modifying said reference current based on said control voltage.

9. The system of claim 8 wherein the voltage controlled impedance includes a metal oxide semiconductor (MOS) transistor, said MOS transistor operating in a triode region.

10. The system of claim 7 wherein said voltage controlled oscillator further includes
    a) a source follower transistor having a gate electrode, a drain electrode, and a source electrode, said gate electrode coupled to receive a first voltage, said drain electrode and source electrode forming a current path, said transistor generating a first current in said current path, said first current proportional to said first voltage, said source follow transistor coupled to said current mirror; wherein said first current is proportional to said reference current.

11. The system of claim 7 further comprising a process dependent biasing circuit that scales an input voltage to said source follower transistor to an operating point that increases VCO gain.

12. The system of claim 11 wherein said biasing circuit includes a network of resistors, said network of resistors scaling said input voltage to an operating point to increase the gain of said VCO.

* * * * *